United States Patent
Koshiishi et al.

(10) Patent No.: US 8,980,046 B2
(45) Date of Patent: Mar. 17, 2015

(54) SEMICONDUCTOR PROCESSING SYSTEM WITH SOURCE FOR DECOUPLED ION AND RADICAL CONTROL

(75) Inventors: Akira Koshiishi, San Jose, CA (US);
Peter L. G. Ventzek, Austin, TX (US);
Jun Shinagawa, San Jose, CA (US);
John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 141 days.

(21) Appl. No.: 13/431,836

(22) Filed: Mar. 27, 2012

(65) Prior Publication Data

US 2013/0157469 A1    Jun. 20, 2013

Related U.S. Application Data

(60) Provisional application No. 61/576,955, filed on Dec. 16, 2011.

(51) Int. Cl.
*C23F 1/00* (2006.01)

(52) U.S. Cl.
USPC ............ 156/345.34; 156/345.48; 156/345.51; 118/723 R

(58) Field of Classification Search
USPC ............. 156/345.28, 345.29, 345.35, 345.38, 156/345.48, 345.39, 345.22, 345.34, 156/345.51, 345.54; 118/723 R, 723 M, 118/723 IR, 723 ME, 723 E
See application file for complete search history.

(56) References Cited

U.S. PATENT DOCUMENTS

| | | |
|---|---|---|
| 4,382,186 A | 5/1983 | Denholm et al. |
| 4,871,421 A | 10/1989 | Ogle et al. |
| 5,083,061 A | 1/1992 | Koshiishi et al. |
| 5,248,371 A | 9/1993 | Maher et al. |
| 5,601,653 A | 2/1997 | Ito |
| 5,604,401 A | 2/1997 | Makishima |
| 5,656,141 A | 8/1997 | Betz et al. |
| 5,904,780 A | 5/1999 | Tomoyasu |
| 5,942,854 A | 8/1999 | Ryoji et al. |
| 6,127,275 A | 10/2000 | Flamm |
| 6,368,678 B1 | 4/2002 | Bluck et al. |
| 6,433,480 B1 | 8/2002 | Stark et al. |

(Continued)

OTHER PUBLICATIONS

D. Söderström et al., "Time Evolution of the Space-Charge Sheath in an RF Hollow Cathode", Journal of Physics: Conference Series 100 (2008) 062020, pp. 5 total.

(Continued)

*Primary Examiner* — Lan Vinh
(74) *Attorney, Agent, or Firm* — Martine Penilla Group, LLP

(57) ABSTRACT

A top plate assembly is positioned above and spaced apart from the substrate support, such that a processing region exists between the top plate assembly and the substrate support. The top plate assembly includes a central plasma generation microchamber and a plurality of annular-shaped plasma generation microchambers positioned in a concentric manner about the central plasma generation microchamber. Adjacently positioned ones of the central and annular-shaped plasma generation microchambers are spaced apart from each other so as to form a number of axial exhaust vents therebetween. Each of the central and annular-shaped plasma generation microchambers is defined to generate a corresponding plasma therein and supply reactive constituents of its plasma to the processing region between the top plate assembly and the substrate support.

21 Claims, 7 Drawing Sheets

(56) References Cited

U.S. PATENT DOCUMENTS

| | | | |
|---|---|---|---|
| 6,563,257 | B2 | 5/2003 | Vojak et al. |
| 6,624,583 | B1 | 9/2003 | Coll et al. |
| 6,764,658 | B2 | 7/2004 | Denes et al. |
| 6,777,352 | B2 | 8/2004 | Tepman et al. |
| 6,787,010 | B2 | 9/2004 | Cuomo et al. |
| 6,867,548 | B2 | 3/2005 | Eden et al. |
| 7,094,315 | B2 | 8/2006 | Chen et al. |
| 7,632,379 | B2 | 12/2009 | Goto et al. |
| 7,872,406 | B2 | 1/2011 | Matacotta |
| 2002/0093294 | A1 | 7/2002 | Czernichowski et al. |
| 2003/0101936 | A1 | 6/2003 | Lee |
| 2004/0163763 | A1 | 8/2004 | Martin et al. |
| 2005/0105580 | A1 | 5/2005 | Giapis et al. |
| 2006/0042545 | A1 | 3/2006 | Shibata et al. |
| 2006/0042752 | A1 | 3/2006 | Rueger |
| 2006/0042755 | A1 | 3/2006 | Holmberg et al. |
| 2006/0054279 | A1 | 3/2006 | Kim et al. |
| 2007/0017636 | A1 | 1/2007 | Goto et al. |
| 2007/0034497 | A1 | 2/2007 | Chistyakov |
| 2007/0037408 | A1 | 2/2007 | Tachibana et al. |
| 2007/0084563 | A1 | 4/2007 | Holland |
| 2007/0108910 | A1 | 5/2007 | Eden et al. |
| 2007/0281105 | A1 | 12/2007 | Mokhlesi et al. |
| 2008/0008640 | A1 | 1/2008 | Watanabe et al. |
| 2008/0135518 | A1 | 6/2008 | Chen et al. |
| 2008/0314523 | A1 | 12/2008 | Iizuka |
| 2009/0061640 | A1 | 3/2009 | Wong et al. |
| 2009/0149028 | A1 | 6/2009 | Marakhtanov et al. |
| 2009/0218212 | A1 | 9/2009 | Denpoh et al. |
| 2009/0263974 | A1* | 10/2009 | Kido et al. ............... 438/758 |
| 2010/0028238 | A1 | 2/2010 | Maschwitz |
| 2010/0068870 | A1 | 3/2010 | Ovshinsky |
| 2010/0184299 | A1 | 7/2010 | Takahashi |
| 2010/0221922 | A1 | 9/2010 | Rueger et al. |
| 2010/0243604 | A1 | 9/2010 | Lee et al. |
| 2010/0267247 | A1 | 10/2010 | Ma et al. |
| 2010/0320916 | A1 | 12/2010 | Yagi et al. |
| 2011/0005681 | A1 | 1/2011 | Savas et al. |
| 2011/0052833 | A1* | 3/2011 | Hanawa et al. ............... 427/534 |
| 2011/0053381 | A1 | 3/2011 | Kobayashi et al. |
| 2011/0132874 | A1* | 6/2011 | Gottscho et al. ............... 216/67 |
| 2011/0212624 | A1* | 9/2011 | Hudson ............... 438/710 |

OTHER PUBLICATIONS

H.S. Lee et al., "Effective Design of Multiple Hollow Cathode Electrode to Enhance the Density of RF Capacitively Coupled Plasma", Applied Physics Letters 97, 081503 (2010), © 2010 American Institute of Physics, pp. 3 total.

Kazunori Koga et al., "Highly Stable a-Si:H Films Deposited by Using Multi-Hollow Plasma Chemical Vapor Deposition", © 2005 Japanese Journal of Applied Physics, vol. 44, No. 48, pp. L1430-L1432.

PCT/US2012/030069, International Search Report and Written Opinion.

PCT/US2012/030072, International Search Report and Written Opinion.

PCT/US2012/036762, International Search Report and Written Opinion.

PCT/US2012/067737, International Search Report and Written Opinion.

Shiratani et al., Journal of Physics: Conference Series 86 (2007) 012021.

Thomas Deconinck et al., "Modeling of Mode Transition Behavior in Argon Microhollow Cathode Discharges", Plasma Processes and Polymers, 2009, 6, pp. 335-346.

Rosenman et al., "Electron Emission from Ferroelectrics," Journal of Applied Physics, vol. 88, No. 11, Dec. 1, 2000.

Paranjpe et al., "Atomic Layer Deposition of AlOx for Thin Film Head Gap Applications," Journal of the Electrochemical Society, 148 (9) G465-G471, Jul. 16, 2001.

M. Ikegawa et al., "Scale-up of a Parallel Plate RF Plasma Etching Reactor by Using Reactive Gas Flow Simulations", Journal of the Electrochemical Society, vol. 148, No. 8, G456-G464, 2001.

F. Fietzke et al., "Plasma Characterization and Technological Application of a Hollow Cathode Plasma Source with an Axial Magnetic Field", Surface and Coatings Technology 205 (2010) 1491-1496.

Japanese Journal of Applied Physics, 48 (2009).

V.A. Godyak, "Electrical Characteristics of Parallel-Plate RF Discharges in Argon", IEEE Transactions on Plasma Science, vol. 19, No. 4 (660), Aug. 1991, pp. 660-676.

* cited by examiner

View A-A

SEMICONDUCTOR PROCESSING SYSTEM WITH SOURCE FOR DECOUPLED ION AND RADICAL CONTROL

CLAIM OF PRIORITY

This application claims priority under 35 U.S.C. 119(e) to U.S. Provisional Patent Application No. 61/576,955, filed Dec. 16, 2011, entitled "Semiconductor Processing System with Source for Decoupled Ion and Radical Control," the disclosure of which is incorporated herein by reference in its entirety.

CROSS-REFERENCE TO RELATED APPLICATIONS

This application is also related to U.S. application Ser. No. 13/104,923, filed on May 10, 2011, entitled "Semiconductor Processing System Having Multiple Decoupled Plasma Sources." This application is also related to U.S. patent application Ser. No. 13/104,925, filed on May 10, 2011, and entitled "Semiconductor Processing System Having Multiple Decoupled Plasma Sources." This application is also related to U.S. patent application Ser. No. 13/084,325, filed on Apr. 11, 2011, and entitled "Multi-Frequency Hollow Cathode and Systems Implementing the Same." This application is also related to U.S. patent application Ser. No. 13/084,343, filed on Apr. 11, 2011, and entitled "Multi-Frequency Hollow Cathode System for Substrate Plasma Processing." The disclosures of the above-identified patent applications are incorporated herein by reference in their entirety.

BACKGROUND OF THE INVENTION

Plasma sources utilized for thin film processing in semiconductor device fabrication are often unable to achieve the most desirable condition for dry etching due to the inability to separately control ion and radical concentrations in the plasma. For example, in some applications, the desirable conditions for plasma etching would be achieved by increasing the ion concentration in the plasma while simultaneously maintaining the radical concentration at a constant level. However, this type of independent ion concentration versus radical concentration control cannot be achieved using the common plasma source typically used for thin film processing. It is within this context that the present invention arises.

SUMMARY OF THE INVENTION

In one embodiment, a plasma generation microchamber is disclosed. The plasma generation microchamber includes an upper electrode having a lower surface that forms an upper boundary of a plasma generation region. The plasma generation microchamber includes a lower electrode having an upper surface that forms a lower boundary of the plasma generation region. The plasma generation microchamber includes a sidewall enclosure formed to extend between the upper and lower electrodes so as to enclose a periphery of the plasma generation region between the upper and lower electrodes. The sidewall enclosure is formed of an electrically insulating material. The plasma generation microchamber includes an upper insulator sheet disposed on an upper surface of the upper electrode opposite from the plasma generation region. The plasma generation microchamber includes an upper ground plate disposed on an upper surface of the upper insulator sheet opposite from the upper electrode. The plasma generation microchamber includes a lower insulator sheet disposed on a lower surface of the lower electrode opposite from the plasma generation region. The plasma generation microchamber includes a lower ground plate disposed on a lower surface of the lower insulator sheet opposite from the lower electrode. Each of the upper ground plate, upper insulator sheet, and upper electrode include a number of fluidly connected passages for supply of a process gas to the plasma generation region. Each of the lower ground plate, lower insulator sheet, and lower electrode include a number of output passages for output of the process gas and reactive constituents from the plasma generation region into a substrate processing region.

In one embodiment, a plasma generation and axial exhaust assembly is disclosed. The assembly includes an upper support plate and a number of support structures affixed to the upper support plate so as to extend in a substantially perpendicular direction away from the upper support plate. The assembly also includes a central cylindrically-shaped plasma generation microchamber affixed to a first portion of the number of support structures at a location substantially centered upon the upper support plate. The assembly also includes a plurality of annular-shaped plasma generation microchambers affixed to corresponding portions of the number of support structures. The plurality of annular-shaped plasma generation microchambers are positioned in a concentric manner about the central cylindrically-shaped plasma generation microchamber. Adjacently positioned ones of the central cylindrically-shaped plasma generation microchamber and the plurality of annular-shaped plasma generation microchambers are spaced apart from each other so as to form a number of axial exhaust vents therebetween. Each axial exhaust vent is fluidly connected to a fluid flow region between the number of support structures and between the upper support plate and each of the plurality of annular-shaped plasma generation microchambers. The fluid flow region is fluidly connected to a peripheral exhaust vent formed at a periphery of the upper support plate between the upper support plate and an outermost one of the plurality of annular-shaped plasma generation microchambers.

In one embodiment, a semiconductor substrate processing system is disclosed. The system includes a substrate support defined to support a substrate in exposure to a processing region. The system also includes a top plate assembly positioned above and spaced apart from the substrate support, such that the processing region exists between the top plate assembly and the substrate support. The top plate assembly includes a central plasma generation microchamber at a location substantially centered on the top plate assembly. The top plate assembly also includes a plurality of annular-shaped plasma generation microchambers positioned in a concentric manner about the central plasma generation microchamber. Adjacently positioned ones of the central plasma generation microchamber and the plurality of annular-shaped plasma generation microchambers are spaced apart from each other so as to form a number of axial exhaust vents therebetween. Each of the central plasma generation microchamber and the plurality of annular-shaped plasma generation microchambers is defined to generate a corresponding plasma therein and supply reactive constituents of its plasma to the processing region between the top plate assembly and the substrate support.

In one embodiment, a method is disclosed for processing a semiconductor substrate. The method includes placing a substrate on a substrate support in exposure to a substrate processing region. The method also includes supplying one or more process gases and radiofrequency power to each of a central plasma generation microchamber and a plurality of annular-shaped plasma generation microchambers positioned above the substrate support in exposure to the substrate processing region. The radiofrequency power transforms the one or more process gases into a plasma in each of the central plasma generation microchamber and the plurality of annular-shaped plasma generation microchambers. The method also includes flowing reactive constituents of the plasma from each of the central plasma generation microchamber and the plurality of annular-shaped plasma generation microchambers into the substrate processing region so as to expose the substrate to the reactive constituents. The method further includes removing process gases from the substrate processing region through axial exhaust vents located between adjacently positioned ones of the central plasma generation microchamber and the plurality of annular-shaped plasma generation microchambers.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In one embodiment, the term "substrate" as used herein refers to a semiconductor wafer. However, it should be understood that in other embodiments, the term "substrate" as used herein can refer to substrates formed of sapphire, GaN, GaAs or SiC, or other substrate materials, and can include glass panels/substrates, metal foils, metal sheets, polymer materials, or the like. Also, in various embodiments, the "substrate" as referred to herein may vary in form, shape, and/or size. For example, in some embodiments, the "substrate" as referred to herein may correspond to a 200 mm (millimeters) semiconductor wafer, a 300 mm semiconductor wafer, or a 450 mm semiconductor wafer. Also, in some embodiments, the "substrate" as referred to herein may correspond to a non-circular substrate, such as a rectangular substrate for a flat panel display, or the like, among other shapes. The "substrate" referred to herein is denoted in the various example embodiment figures as substrate 105.

Figure 1A:
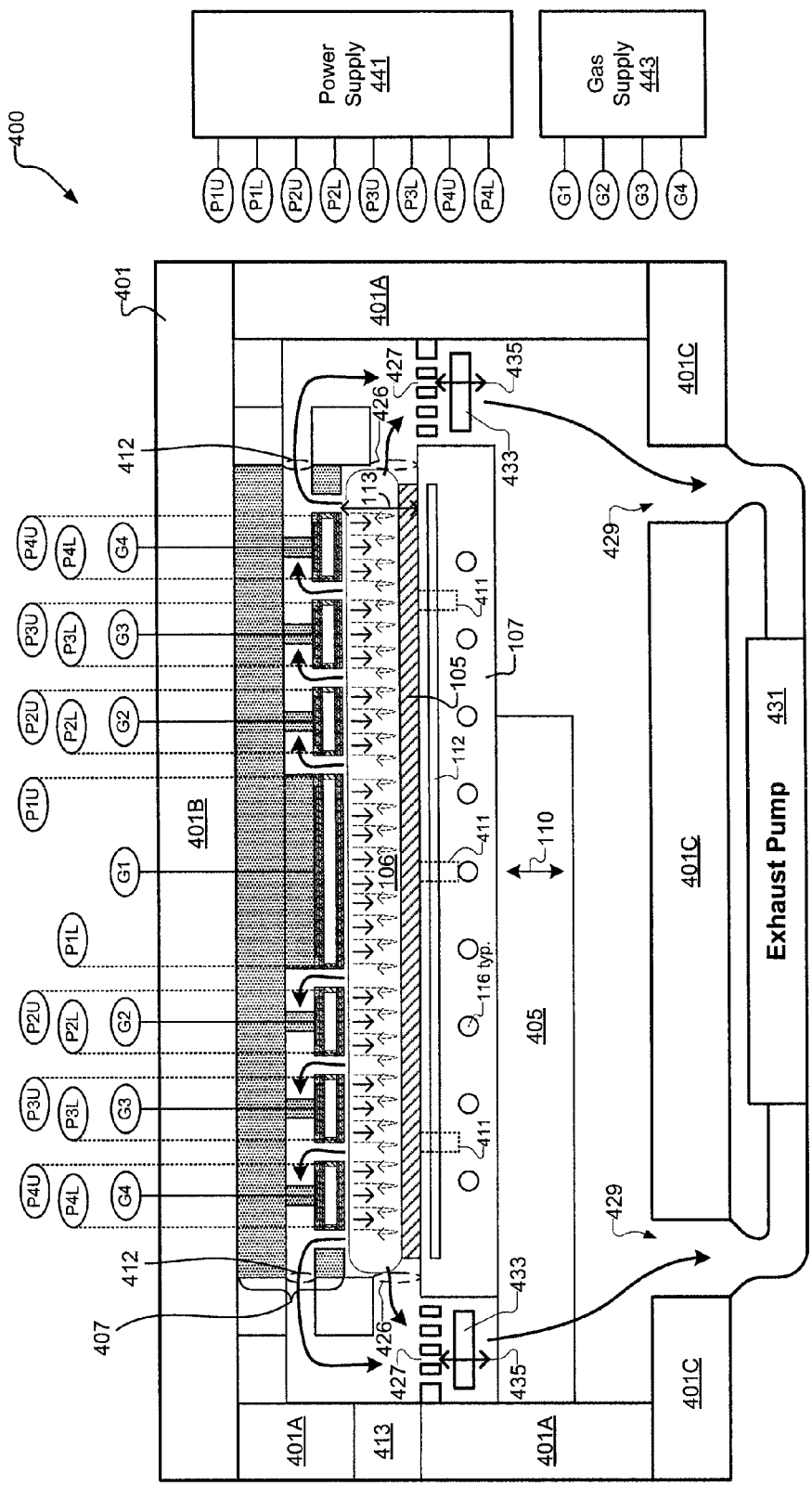
FIG. 1A shows a vertical cross-section of a semiconductor substrate processing system, in accordance with one embodiment of the present invention.

FIG. 1A shows a vertical cross-section of a semiconductor substrate processing system 400, in accordance with one embodiment of the present invention. The system 400 includes a chamber 401 formed by a top structure 401B, a bottom structure 401C, and sidewalls 401A extending between the top structure 401B and bottom structure 401C. The chamber 401 encloses a processing region 106. In various embodiments, the chamber sidewalls 401A, top structure 401B, and bottom structure 401C can be formed from different materials, such as stainless steel or aluminum, by way of example, so long as the chamber 401 materials are structurally capable of withstanding pressure differentials and temperatures to which they will be exposed during plasma processing, and are chemically compatible with the plasma processing environment.

The system 400 also includes a substrate support 107 disposed within the chamber 401 and defined to support the substrate 105 in exposure to the processing region 106. The substrate support 107 is defined to hold the substrate 105 thereon during performance of a plasma processing operation on the substrate 105. In the example embodiment of FIG. 1A, the substrate support 107 is held by a cantilevered arm 405 affixed to a wall 401A of the chamber 401. However, in other embodiments, the substrate support 107 can be affixed to the bottom plate 401C of the chamber 401 or to another member disposed within the chamber 401. In various embodiments, the substrate support 107 can be formed from different materials, such as stainless steel, aluminum, or ceramic, by way of example, so long as the substrate support 107 material is structurally capable of withstanding pressure differentials and temperatures to which it will be exposed during plasma processing, and is chemically compatible with the plasma processing environment.

In one embodiment, the substrate support 107 includes a bias electrode 112 for generating an electric field to attract ions toward the substrate support 107, and thereby toward the substrate 105 held on the substrate support 107. Also, in one embodiment, the substrate support 107 includes a number of cooling channels 116 through which a cooling fluid can be flowed during plasma processing operations to maintain temperature control of the substrate 105. Also, in one embodiment, the substrate support 107 can include a number of lifting pins 411 defined to lift and lower the substrate 105 relative to the substrate support 107. In one embodiment, a door assembly 413 is disposed within the chamber wall 401A to enable insertion and removal of the substrate 105 into/from the chamber 401. Additionally, in one embodiment, the substrate support 107 is defined as an electrostatic chuck equipped to generate an electrostatic field for holding the substrate 105 securely on the substrate support 107 during plasma processing operations.

The system 400 further includes a top plate assembly 407 disposed within the chamber 401 above and spaced apart from the substrate support 107, so as to be positioned above and spaced apart from the substrate 105 when positioned on the substrate support 107. The substrate processing region 106 exists between the top plate assembly 407 and the substrate support 107, so as to exist over the substrate 105 when positioned on the substrate support 107. In one embodiment, the substrate support 107 is defined to be movable in a direction 110 perpendicular to a top surface of the substrate support 107, such that a process gap distance 113, as measured perpendicularly across the processing region 106 between the top plate assembly 407 and substrate support 107 is adjustable within a range extending from about 2 cm to about 10 cm. Also, in one embodiment, a vertical position of the substrate support 107 relative to the top plate assembly 407, vice-versa, is adjustable either during performance of the plasma processing operation or between plasma processing operations.

Figure 2A:
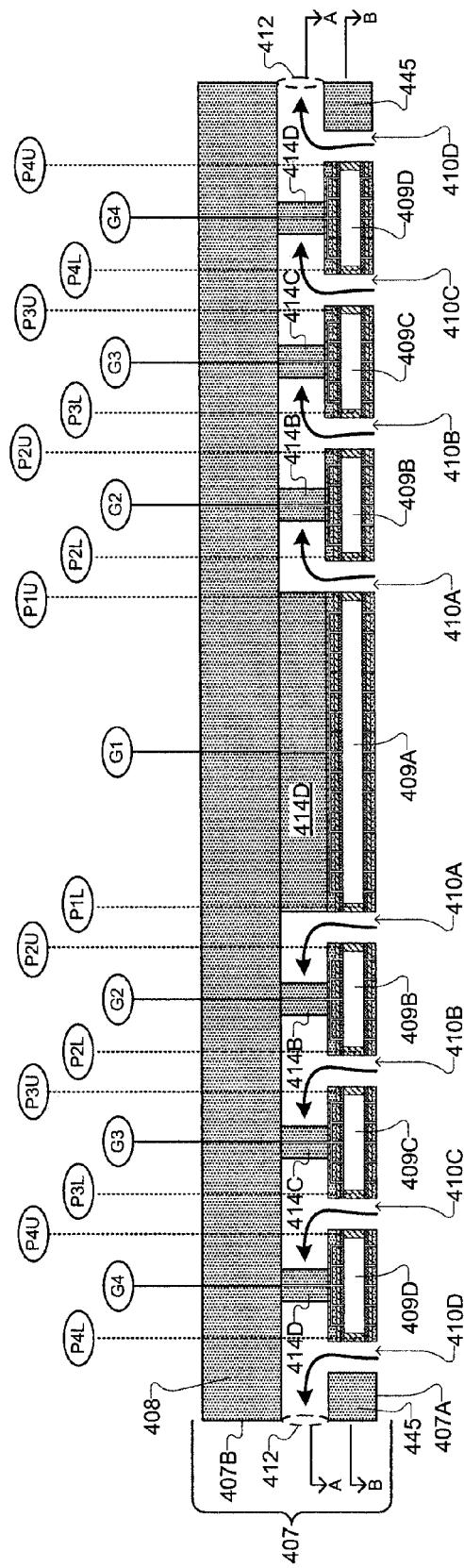
FIG. 2A shows an isolated vertical cross-section view of the top plate assembly, in accordance with one embodiment of the present invention.

FIG. 2A shows an isolated vertical cross-section view of the top plate assembly 407, in accordance with one embodiment of the present invention. The top plate assembly 407 includes an upper support plate 408. The top plate assembly 407 also includes a number of plasma generation microchambers 409A-409D affixed to the upper support plate 408 by a number of support structures 414A-414D, respectively. The number of support structures 414A-414D are formed to allow for radial separation between adjacently positioned ones of the number of plasma generation microchambers 409A-409D, and to allow for axial separation between the upper support plate 408 and the number of plasma generation microchambers 409A-409D. Also, each of the number of support structures 414A-414D is formed in a spatially localized manner, such that fluid flow paths exist between neighboring support structures 414A-414D for a given plasma generation microchamber 409A-409D.

In this manner, the radial separation between adjacently positioned plasma generation microchambers 409A-409D and the fluid flow paths between neighboring support structures 414A-414D combine to form a number axial exhaust vents 410A-410D that are fluidly connected to a peripheral exhaust vent 412, wherein the number of axial exhaust vents 410A-410D have a respective fluid entrance at a bottom surface 407A of the top plate assembly 407, and wherein the peripheral exhaust vent 412 has a fluid exit at a side peripheral surface 407B of the top plate assembly 407.

Figure 2B:
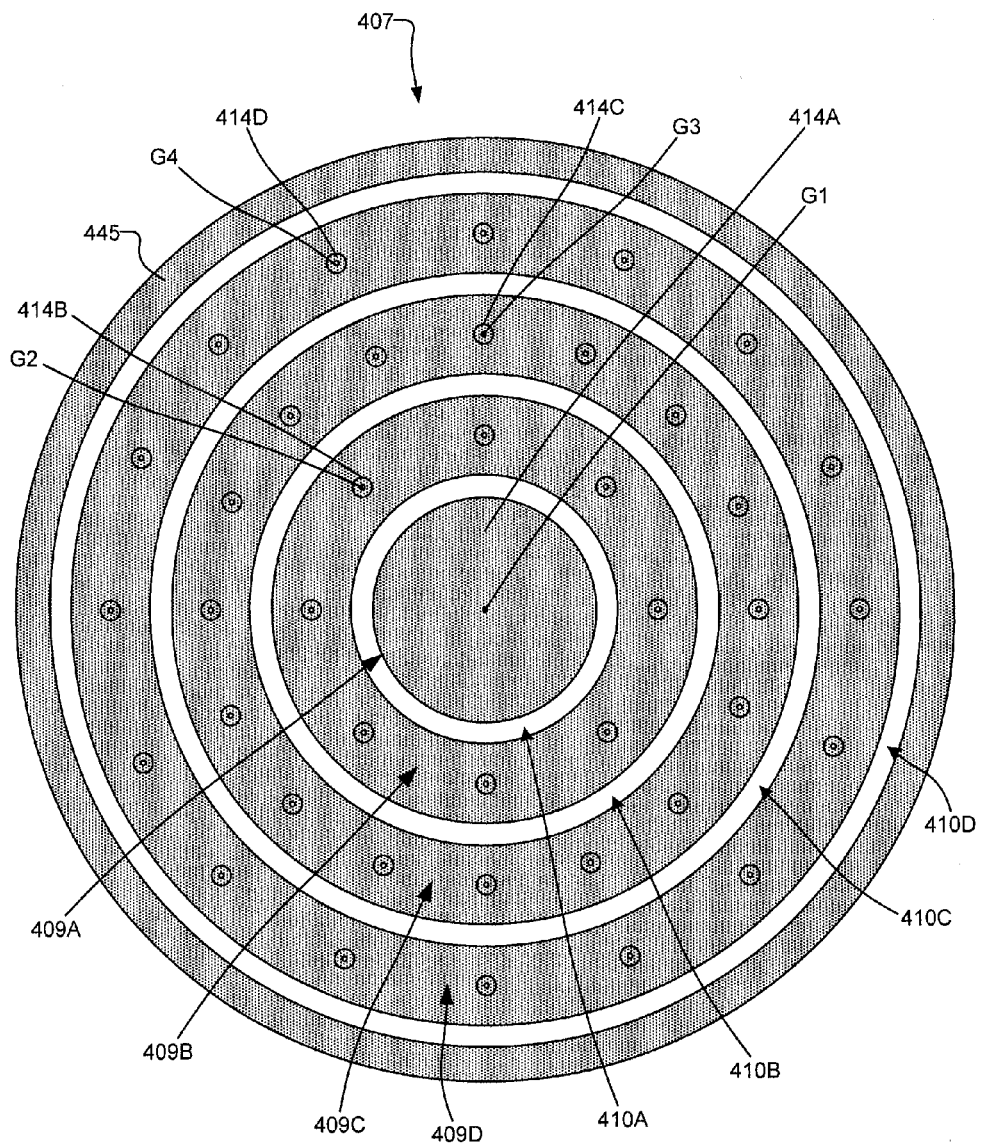
FIG. 2B shows a horizontal cross-section view A-A of the top plate assembly, as delineated in FIG. 2A, in accordance with one embodiment of the present invention.

FIG. 2B shows a horizontal cross-section view A-A of the top plate assembly 407, as delineated in FIG. 2A, in accordance with one embodiment of the present invention. FIG. 2B shows a support structure 414A for the underlying plasma generation microchamber 409A. Also, a gas input passage G1 for the plasma generation microchamber 409A is shown as a fluid passage formed through the support structure 414A. Although the example embodiment of FIG. 2B shows one gas input passage G1 for the plasma generation microchamber 409A, it should be understood that other embodiments can utilize a different number of gas input passages G1 for the plasma generation microchamber 409A, as necessary to satisfy operational requirements.

FIG. 2B also shows a number of support structures 414B for the underlying plasma generation microchamber 409B. Also, a number of gas input passages G2 for the plasma generation microchamber 409B are shown as fluid passages respectively formed through the support structures 414B. Although the example embodiment of FIG. 2B shows eight support structures 414B with eight corresponding gas input passages G2 for the plasma generation microchamber 409B, it should be understood that other embodiments can utilize a different number of support structures 414B and/or gas input passages G2 for the plasma generation microchamber 409B, as necessary to satisfy operational requirements. Also, in one embodiment, some support structures 414B can be defined without a gas input passage G2 formed therein.

FIG. 2B also shows a number of support structures 414C for the underlying plasma generation microchamber 409C. Also, a number of gas input passages G3 for the plasma generation microchamber 409C are shown as fluid passages respectively formed through the support structures 414C. Although the example embodiment of FIG. 2B shows sixteen support structures 414C with sixteen corresponding gas input passages G3 for the plasma generation microchamber 409C, it should be understood that other embodiments can utilize a different number of support structures 414C and/or gas input passages G3 for the plasma generation microchamber 409C, as necessary to satisfy operational requirements. Also, in one embodiment, some support structures 414C can be defined without a gas input passage G3 faulted therein.

FIG. 2B also shows a number of support structures 414D for the underlying plasma generation microchamber 409D. Also, a number of gas input passages G4 for the plasma generation microchamber 409D are shown as fluid passages respectively formed through the support structures 414D. Although the example embodiment of FIG. 2B shows sixteen support structures 414D with sixteen corresponding gas input passages G4 for the plasma generation microchamber 409D, it should be understood that other embodiments can utilize a different number of support structures 414D and/or gas input passages G4 for the plasma generation microchamber 409D, as necessary to satisfy operational requirements. Also, in one embodiment, some support structures 414D can be defined without a gas input passage G4 formed therein.

FIG. 2B also shows that plasma generation microchambers 409A and 409B are positioned in a concentric manner relative to each other so as to be separated by the axial exhaust vent 410A. FIG. 2B also shows that plasma generation microchambers 409B and 409C are positioned in a concentric manner relative to each other so as to be separated by the axial exhaust vent 410B. FIG. 2B also shows that plasma generation microchambers 409C and 409D are positioned in a concentric manner relative to each other so as to be separated by the axial exhaust vent 410C. FIG. 2B also shows that the plasma generation microchamber 409D is positioned in a concentric manner relative to an outer support ring 445 so as to form the axial exhaust vent 410D between the plasma generation microchamber 409D and the outer support ring 445.

As shown in FIG. 2B, the axial exhaust vents 410A-410D are in fluid communication with the flow paths, i.e., open regions, between neighboring support structures 414A-414D to provide for fluid flow from the entrances of the axial exhaust vents 410A-410D at the bottom surface 407A of the top plate assembly 407 to the exit of the peripheral exhaust vent 412 at the side peripheral surface 407B of the top plate assembly 407. Thus, the structure of the top plate assembly 407 provides for exhaust fluid flow in an axial direction substantially perpendicular to the bottom surface 407A of the top plate assembly 407, through open regions between the plasma generation microchambers 409B-409D and the upper support plate 408 and between neighboring support structures 414A-414D, to the peripheral exhaust vent 412 at the side peripheral surface 407B of the top plate assembly 407.

With reference back to FIG. 2A, each of the plasma generation microchambers 409A-409D is connected to a first power supply for an upper electrode and a second power supply for a lower electrode. Specifically, upper electrodes 451A-451D respectively disposed within the plasma generation microchambers 409A-409D have respective power supply connections P1U, P2U, P3U, and P4U. Also, lower electrodes 453A-453D respectively disposed within the plasma generation microchambers 409A-409D have respective power supply connections P1L, P2L, P3L, and P4L. As shown in FIG. 1A, each of power supply connections P1U, P2U, P3U, P4U, P1L, P2L, P3L, P4L is connected to a power supply 441. The power supply 441 is defined to supply power to each of the power supply connections P1U, P2U, P3U, P4U, P1L, P2L, P3L, P4L in an independently controlled manner. Therefore, the power supplied to each of the power supply connections P1U, P2U, P3U, P4U, P1L, P2L, P3L, P4L, i.e., to each of the upper electrodes 451A-451D and lower electrodes 453A-453D within the plasma generation microchambers 409A-409D, can be independently controlled with regard any specification of the power supply, such as amplitude, frequency, voltage, duration, etc.

In one embodiment, the power supplied to any given one of the upper electrodes 451A-451D and the lower electrodes 453A-453D is either DC power, RF power, or a combination of DC and RF power. In one embodiment, the power supplied to any given one of the upper electrodes 451A-451D and the lower electrodes 453A-453D is RF power having a frequency of either 2 MHz, 27 MHz, 60 MHz, 400 kHz, or a combination thereof.

Also, with regard to FIG. 2A, each of the gas supply passages G1-G4 is plumbed to a gas supply 443. The gas supply 443 is defined to supply one or more process gases and/or gas mixtures to each of the gas supply passages G1-G4 in an independently controlled manner. Therefore, the process gas supplied to each of the gas supply passages G1-G4, i.e., to each of the plasma generation microchambers 409A-409D, can be independently controlled with regard to any specification of the process gas supply, such as gas type, gas mixture, flow rate, pressure, temperature, duration, etc.

Figure 2C:
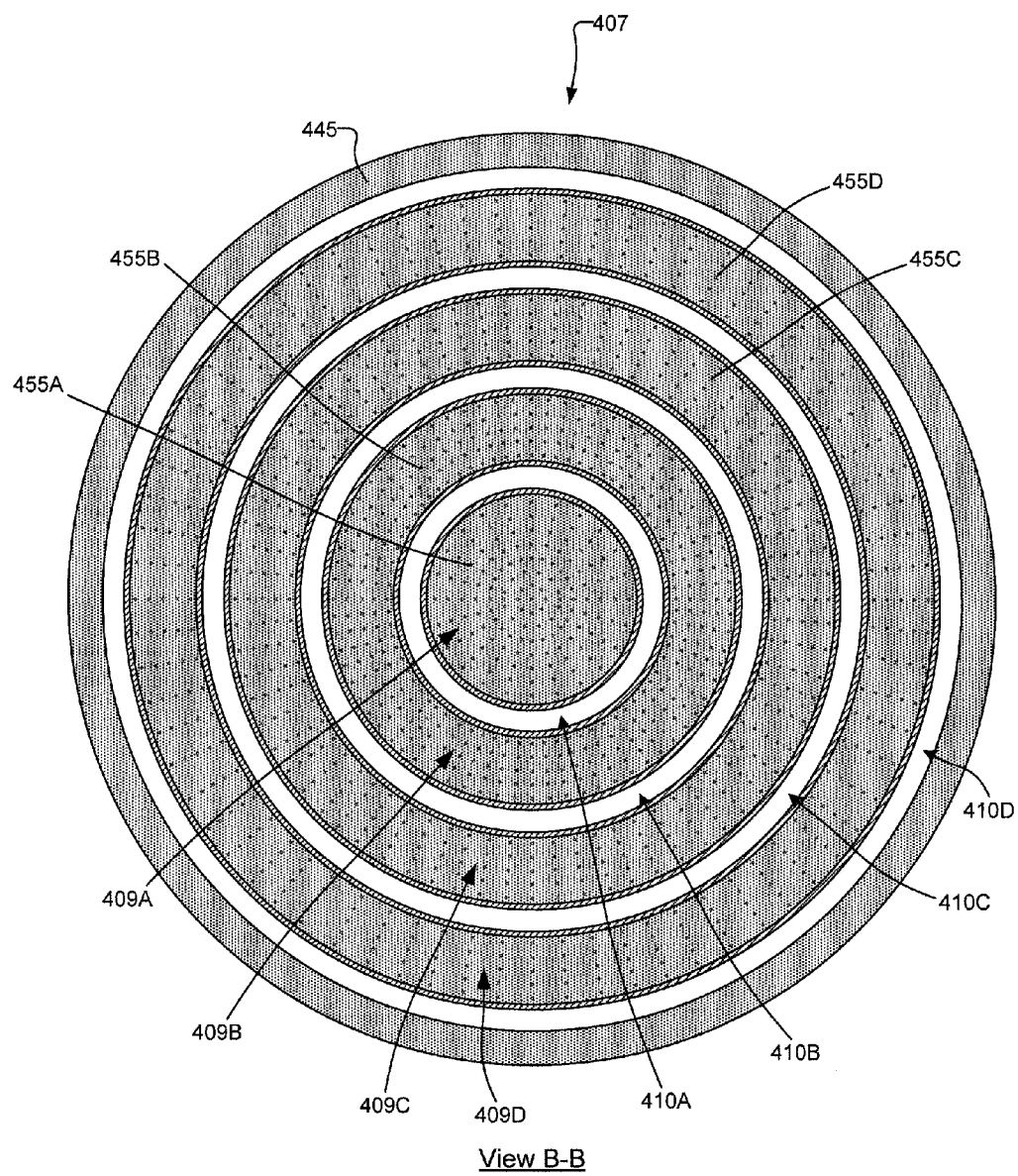
FIG. 2C shows a horizontal cross-section view B-B of the top plate assembly, as delineated in FIG. 2A, in accordance with one embodiment of the present invention.

FIG. 2C shows a horizontal cross-section view B-B of the top plate assembly 407, as delineated in FIG. 2A, in accordance with one embodiment of the present invention. The horizontal cross-section view B-B is drawn through a mid-height position of the plasma generation microchambers 409A-409D, so as to show a distribution of outlets 455A-455D for each of the plasma generation microchambers 409A-409D, respectively. In one embodiment, the plasma generation microchambers 409A-409D are defined to operate at internal pressures up to about one Torr (T). Also, in one embodiment, the processing region 106 is operated within a pressure range extending from about 1 mT to about 100 mT. The outlets 455A-455D of the plasma generation microchambers 409A-409D are defined to provide and control the pressure drop between the interiors of the plasma generation microchambers 409A-409D and the processing region 106.

During operation of the system 400, the process gases supplied through the gas supply passages G1-G4 are transformed into plasmas within the plasma generation microchambers 409A-409D under the influence of the power supplied to the upper electrodes 451A-451D and lower electrodes 453A-453D. Reactive constituents within the plasmas move through the outlets 455A-455D of the plasma generation microchambers 409A-409D into the substrate processing region 106 over the substrate support 107, i.e., onto the substrate 105 when disposed on the substrate support 107.

The used process gas flows from the substrate processing region 106 through the axial exhaust vents 410A-410D and out of the peripheral exhaust vent 412 in the top plate assembly 407 toward chamber peripheral vents 427. Also, used process gas flows from the substrate processing region 106 through a radial exhaust vent 426 toward the chamber peripheral vents 427. From the chamber peripheral vents 427, the used process gas is pumped out through chamber exhaust ports 429 by an exhaust pump 431. In one embodiment, a flow throttling device 433 is provided to control a flow rate of the used process gas from the substrate processing region 106. In one embodiment, the flow throttling device 433 is defined as a ring structure that is movable toward and away from the peripheral vents 427, as indicated by arrows 435.

Figure 1B:
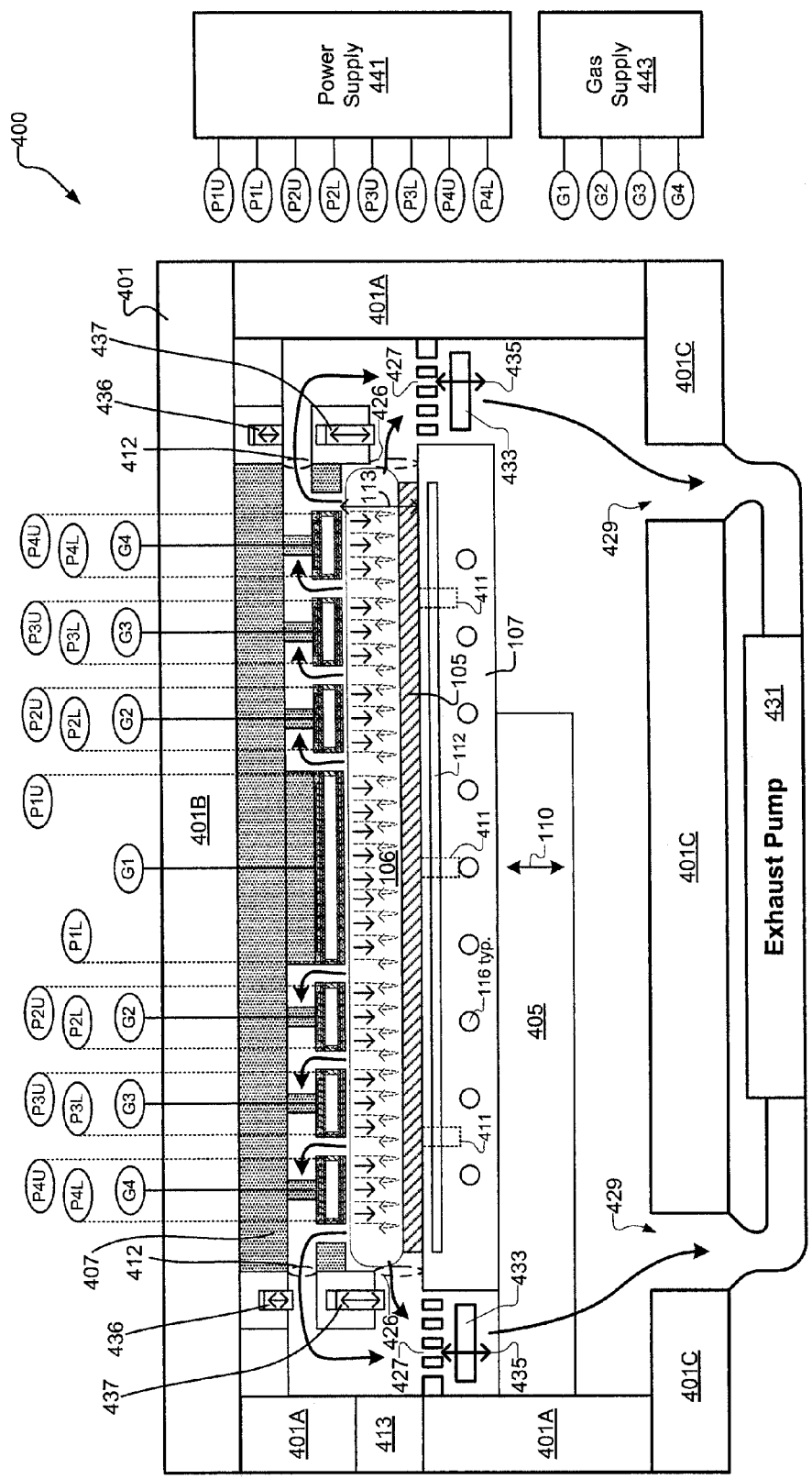
FIG. 1B shows a vertical cross-section of a variation of the semiconductor substrate processing system of FIG. 1A, in accordance with one embodiment of the present invention.

FIG. 1B shows a vertical cross-section of a variation of the semiconductor substrate processing system 400, in accordance with one embodiment of the present invention. Specifically, FIG. 1B shows a flow throttling device 436 for controlling a flow rate of the used process gas through the peripheral exhaust vent 412 in the top plate assembly 407. Also, FIG. 1B shows a flow throttling device 437 for controlling a flow rate of the used process gas through the radial exhaust vent 426. It should be understood that each of the flow throttling device 436 and 437 can be moved up and down in an independently controlled manner, thereby providing independent control of the used process gas flow rate through the peripheral exhaust vent 412 in the top plate assembly 407 and the radial exhaust vent 426.

In one embodiment, such as shown in FIG. 1A, the system 400 does not implement either of the flow throttling devices 436 and 437. In another embodiment, such as shown in FIG. 1B, the system 400 implements both of the flow throttling devices 436 and 437. In other embodiments, the system 400 can implement either the flow throttling device 436 or the flow throttling device 437. Also, in one embodiment in which the system 400 implements both the flow throttling devices 436 and 437, the system 400 may not implement the flow throttling device 433. It should be understood that a position of each of the flow throttling devices 433, 436, and 437 can be independently controlled through a respectively formed mechanical linkage to a respective translation device, such as a stepper motor, or servo, among others.

Figure 2D:
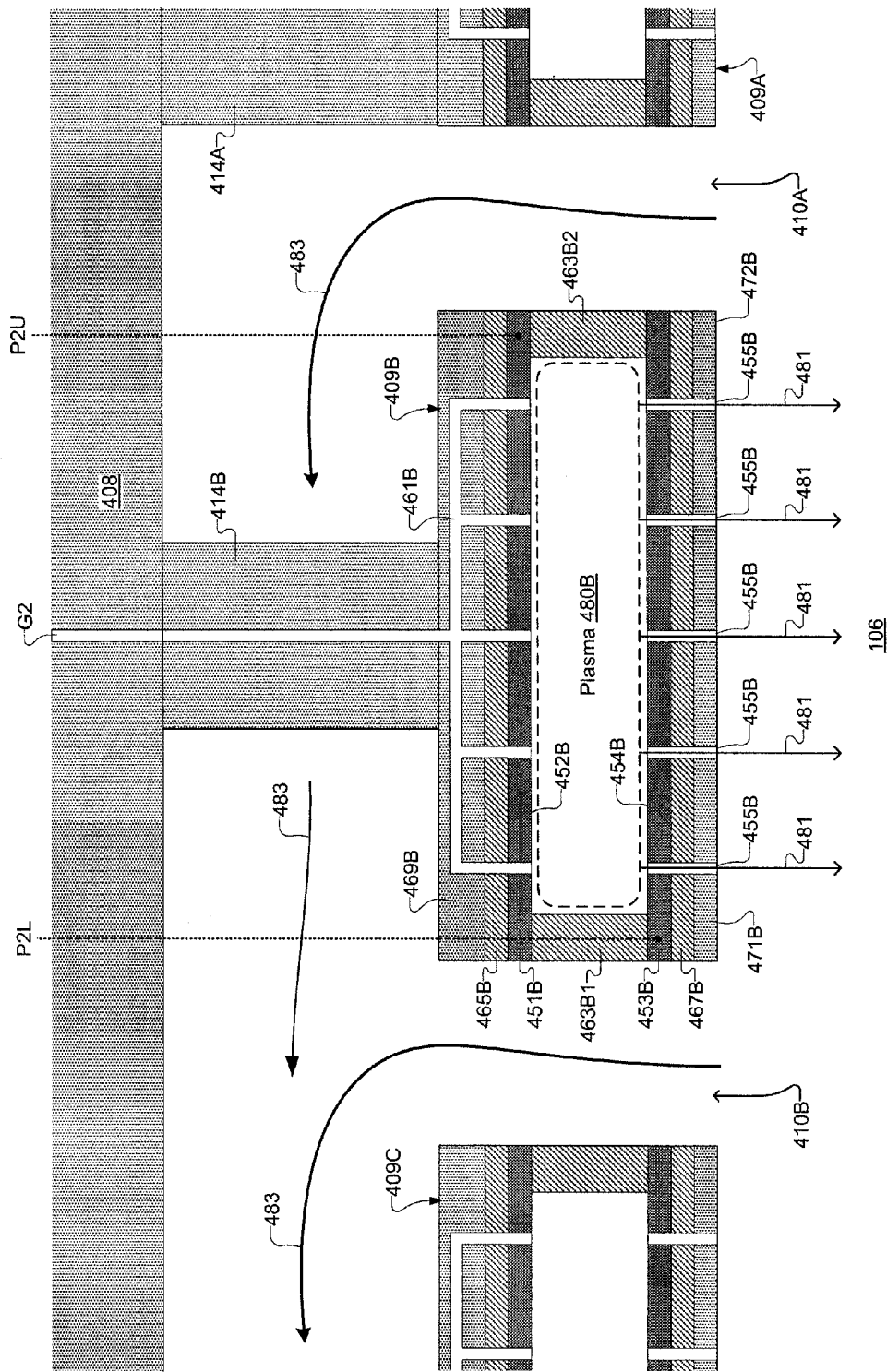
FIG. 2D shows a close-up vertical cross-section view of the plasma generation microchamber, in accordance with one embodiment of the present invention.

FIG. 2D shows a close-up vertical cross-section view of the plasma generation microchamber 409B, in accordance with one embodiment of the present invention. The plasma generation microchamber 409B includes the upper electrode 451B having a lower surface 452B that forms an upper boundary of a plasma generation region 480B. The plasma generation microchamber 409B also includes the lower electrode 453B having an upper surface 454B that forms a lower boundary of the plasma generation region 480B. The plasma generation microchamber 409B also includes a sidewall enclosure 463B1/463B2 formed to extend between the upper electrode 451B and the lower electrode 453B, so as to enclose a periphery of the plasma generation region 480B between the upper electrode 451B and the lower electrode 453B. The sidewall enclosure 463B1/463B2 is formed of an electrically insulating material. In one embodiment, the sidewall enclosure 463B1/463B2 material has an electrical resistance within a range extending from about 3 picoFarads to about 10 picoFarads.

The plasma generation microchamber 409B also includes an upper insulator sheet 465B disposed on an upper surface of the upper electrode 451B opposite from the plasma generation region 480B. The upper insulator sheet 465B is formed of an electrically insulating material. In one embodiment, the upper insulator sheet 465B material has an electrical resistance within a range extending from about 50 picoFarads to about 70 picoFarads. The plasma generation microchamber 409B also includes an upper ground plate 469B disposed on an upper surface of the upper insulator sheet 465B opposite from the upper electrode 451B.

The plasma generation microchamber 409B also includes a lower insulator sheet 467B disposed on a lower surface of the lower electrode 453B opposite from the plasma generation region 480B. The lower insulator sheet 467B is formed of an electrically insulating material. In one embodiment, the lower insulator sheet 467B material has an electrical resistance within a range extending from about 50 picoFarads to about 70 picoFarads. The plasma generation microchamber 409B also includes a lower ground plate 471B disposed on a lower surface of the lower insulator sheet 467B opposite from the lower electrode 453B.

Each of the upper ground plate 469B, upper insulator sheet 465B, and upper electrode 451B includes a number of fluidly connected passages 461B for supply of the process gas to the plasma generation region 480B from the gas supply passage G2. In one embodiment, the fluidly connected passages 461B are defined to provide a substantially uniform distribution of the process gas into the plasma generation region 480B.

Also, each of the lower ground plate 471B, lower insulator sheet 467B, and lower electrode 453B include a number of output passages 455B for output of the used process gas and reactive constituents from the plasma generation region 480B into the substrate processing region 106, as indicated by arrows 481. In one embodiment, the output passages 455B are distributed to provide a substantially uniform distribution of the reactive constituents from the plasma generation region 480B into the portion of the substrate processing region 106 beneath the plasma generation microchamber 409B. The arrows 483 represent exhaust gas flow paths through the axial exhaust vents 410A, 410B toward the peripheral exhaust vent 412.

In one embodiment, each of the number of output passages 455B for output of the process gas and reactive constituents from the plasma generation region 480B is defined as a cylindrical hole extending in a substantially perpendicular direction between a lower surface 472B of the lower ground plate 471B and the upper surface 454B of the lower electrode 453B. In one embodiment, each of the number of output passages 455B has a diameter within a range extending from about 0.5 millimeter to about 2 millimeters. Also, in one embodiment, a distance as measured perpendicularly between the lower surface 472B of the lower ground plate 471B and the upper surface 454B of the lower electrode 453B, i.e., output passage length, is within a range extending from about 2 millimeters to about 5 millimeters. Also, in one embodiment, each of the number of output passages 455B has an aspect ratio within a range extending from about 4-to-1 to about 10-to-1. In one embodiment, the output passages 455B, and the equivalent output passages for plasma generation microchambers 409A, 409C, and 409D, are defined to have a diameter less than 2.4 millimeters, and a length greater than 3.5 millimeters.

It should be understood that the high aspect ratio of the output passages 455B provides for an increased pressure differential between the plasma generation region 480B within the plasma generation microchamber 409B and the substrate processing region 106, such that the plasma generation region 480B can be operated at a higher pressure relative to the substrate processing region 106. In one embodiment, the plasma generation region 480B is operated at an internal pressure greater than 1 Torr, such that three times the mean free path of ions generated within the plasma generation region 480B is much less than the plasma sheath length at the boundary of the plasma generation region 480B, thereby reducing the ion sputtering against the interior surfaces of the plasma generation microchamber 409B.

With reference back to FIG. 1A, the electrode 112 within the substrate support 107 is defined to apply a bias voltage across the processing region 106 between the substrate support 107 and the lower surface, e.g., 472B, of the top plate assembly 407. Appropriately charged species formed within the plasma generation microchambers 409A-409D can be pulled into the processing region 106 by the bias voltage applied across the processing region 106 by the electrode 112.

In one embodiment, the upper electrode 451B is defined as a solid plate of electrically conductive material with the exception of the number of fluidly connected passages 461B for supply of the process gas to the plasma generation region 480B. Also, in one embodiment, the lower electrode 453B is defined as a solid plate of electrically conductive material with the exception of the output passages 455B. Each of the upper electrode 451B and lower electrode 453B is connected to receive power from the power supply 441, whereby the received power is used to transform the process gas within the plasma generation region 480B into a plasma.

In one embodiment, the upper electrode 451B is electrically connected to a first power supply by way of the power supply connection P2U, and the lower electrode 453B is electrically connected to a second power supply by way of the power supply connection P2L. In one embodiment, each of the first and second power supplies is independently controllable. Also, in one embodiment, a phase difference between the first and second power supplies is 180 degrees. In one embodiment, low frequency (less than 1 MHz) RF power is supplied to both the upper electrode 451B and the lower electrode 453B, at 180 degrees out of phase between the upper electrode 451B and the lower electrode 453B, to generate a high density plasma within the plasma generation region 480B. Use of the low frequency (less than 1 MHz) RF power also provides a high sustained voltage which generates high-velocity bullet electrons that are ejected through the output passages 455B to enhance an electron beam excited plasma (EBEP) effect within the substrate processing region 106.

In one embodiment, a thickness of the upper electrodes 451A-451D, as measured in the vertical direction extending perpendicularly between top and bottom surfaces of the upper electrodes 451A-451D, is within a range extending from about 2 millimeters to about 50 millimeters. In one embodiment, the thickness of the upper electrodes 451A-451D is about 5 millimeters. In one embodiment, a thickness of the lower electrodes 453A-453D, as measured in the vertical direction extending perpendicularly between top and bottom surfaces of the lower electrodes 453A-453D, is within a range extending from about 2 millimeters to about 50 millimeters. In one embodiment, the thickness of the lower electrodes 453A-453D is about 5 millimeters.

In one embodiment, a thickness of the upper insulator sheets 465A-465D, as measured in the vertical direction extending perpendicularly between top and bottom surfaces of the upper insulator sheets 465A-465D, is within a range extending from about 2 millimeters to about 50 millimeters. In one embodiment, the thickness of the upper insulator sheets 465A-465D is about 10 millimeters. In one embodiment, a thickness of the lower insulator sheets 467A-467D, as measured in the vertical direction extending perpendicularly between top and bottom surfaces of the lower insulator sheets 467A-467D, is within a range extending from about 2 millimeters to about 50 millimeters. In one embodiment, the thickness of the lower insulator sheets 467A-467D is about 10 millimeters.

In one embodiment, a thickness of the upper ground plates 469A-469D, as measured in the vertical direction extending perpendicularly between top and bottom surfaces of the upper ground plates 469A-469D, is within a range extending from about 10 millimeters to about 50 millimeters. In one embodiment, the thickness of the upper ground plates 469A-469D is about 20 millimeters. In one embodiment, a thickness of the lower ground plates 471A-471D, as measured in the vertical direction extending perpendicularly between top and bottom surfaces of the lower ground plates 471A-471D, is within a range extending from about 10 millimeters to about 50 millimeters. In one embodiment, the thickness of the lower ground plates 471A-471D is about 20 millimeters.

In various embodiments, the upper electrodes 451A-451D and the lower electrodes 453A-453D are formed of aluminum, silicon, silicon carbide, or other machinable metals, or any combination thereof. In one embodiment, both the upper electrodes 451A-451D and the lower electrodes 453A-453D are formed of silicon. In various embodiments, the sidewalls enclosures, e.g., 463B1/463B2, are formed of aluminum oxide, aluminum nitride, yttrium oxide, quartz, or other machinable insulators, or any combination thereof. In one embodiment, each of the sidewalls enclosures, e.g., 463B1/463B2, is formed of aluminum oxide.

In various embodiments, the upper insulator sheets 465A-465D and the lower insulator sheets 467A-467D, are formed of aluminum oxide, aluminum nitride, yttrium oxide, quartz, or other machinable insulators, or any combination thereof. In one embodiment, each of the upper insulator sheets 465A-465D and the lower insulator sheets 467A-467D is formed of aluminum oxide. In various embodiments, the upper ground plates 469A-469D and the lower ground plates 471A-471D are formed of aluminum, silicon, silicon carbide, or other machinable metals, or any combination thereof. In one embodiment, both the upper ground plates 469A-469D and the lower ground plates 471A-471D are formed of silicon.

It should be understood that the structure of the plasma generation microchamber 409B is representative of the structure of each of the plasma generation microchambers 409C and 409D. Each of the plasma microchambers 409B, 409C, and 409D in the example system 400 of FIGS. 1A-2D is annular-shaped. More specifically, each of the upper electrode 451B, upper insulator sheet 465B, upper ground plate 469B, lower electrode 453B, lower insulator sheet 467B, and lower ground plate 471B in the plasma generation microchamber 409B, and its equivalent in the plasma generation microchambers 409C and 409D, has an annular area when viewed perpendicular to its upper or lower surface. Also, the sidewall enclosure 463B1/463B2 in the plasma generation microchamber 409B, and its equivalent in the plasma generation microchambers 409C and 409D, includes an inner ring-shaped sidewall 463B2 and an outer ring-shaped sidewall 463B1 when viewed perpendicular to their upper or lower surface, such that each of the plasma generation microchambers 409B, 409C, and 409D is annular-shaped.

Also, it should be understood that the structure of the plasma generation microchamber 409B is representative of the structure of the plasma generation microchamber 409A, with the exception of the overall shape of the plasma generation microchamber 409A. While the plasma generation microchamber 409B is annular-shaped, the plasma generation microchamber 409A is cylindrically-shaped. More specifically, in the plasma generation microchamber 409A, each of the upper electrode (like 451B), upper insulator sheet (like 465B), upper ground plate (like 469B), lower electrode (like 453B), lower insulator sheet (like 467B), and lower ground plate (like 471B) has a circular area when viewed perpendicular to its upper or lower surface. Also, in the plasma generation microchamber 409A, the sidewall enclosure (like 463B1) is ring-shaped when viewed perpendicular to its upper or lower surface, such that the plasma generation microchamber 409A is cylindrically-shaped.

With reference back to FIG. 2A, it should be understood that the top plate assembly 407 is a plasma generation and axial exhaust assembly. In the top plate assembly 407, the support structures 414A-414D are affixed to the upper support plate 408 so as to extend in a substantially perpendicular direction away from the upper support plate 408. The plasma generation microchamber 409A is a central cylindrically-shaped plasma generation microchamber 409A affixed to a first portion of the support structures 414A at a location substantially centered upon the upper support plate 408. The plasma generation microchambers 409B-409D represent a plurality of annular-shaped plasma generation microchambers 409B-409D affixed to corresponding portions of the number of support structures 414B-414D, respectively. The plurality of annular-shaped plasma generation microchambers 409B-409D are positioned in a concentric manner about the central cylindrically-shaped plasma generation microchamber 409A.

Adjacently positioned ones of the central cylindrically-shaped plasma generation microchamber 409A and the plurality of annular-shaped plasma generation microchambers 409B-409D are spaced apart from each other so as to form the axial exhaust vents 410A-410D therebetween. Each axial exhaust vent 410A-410D is fluidly connected to a fluid flow region between the support structures 414A-414D and between the upper support plate 408 and each of the plurality of annular-shaped plasma generation microchambers 409B-409D. The fluid flow region is fluidly connected to the peripheral exhaust vent 412 formed at the periphery of the upper support plate 408, between the upper support plate 408 and the outermost one of the plurality of annular-shaped plasma generation microchambers 409D.

Each of the central cylindrically-shaped plasma generation microchamber 409A and the plurality of annular-shaped plasma generation microchambers 409B-409D includes a plasma generation region (like 480B) fluidly connected to the process gas supply 443. Each of the central cylindrically-shaped plasma generation microchamber 409A and the plurality of annular-shaped plasma generation microchambers 409B-409D includes an upper electrode (like 451B) disposed in exposure to the plasma generation region (like 480B), and a lower electrode (like 453B) disposed in exposure to the plasma generation region (like 480B). In one embodiment, each of the upper electrodes (like 451B) and each of the lower electrodes (like 453B) is electrically connected to a separate independently controllable power supply 441.

In each of the central cylindrically-shaped plasma generation microchamber 409A and the plurality of annular-shaped plasma generation microchambers 409B-409D, each of the upper electrodes (like 451B) and lower electrodes (like 453B) is physically separated by an electrically insulating sidewall enclosure (like 463B1/463B2). The sidewall enclosure (like 463B1/463B2) forms a peripheral boundary of the plasma generation region (like 480B). Also, each of the central cylindrically-shaped plasma generation microchamber 409A and the plurality of annular-shaped plasma generation microchambers 409B-409D includes the output passages (like 455B) formed to direct a fluid flow from the plasma generation region (like 480B) in a direction substantially perpendicular to and away from the upper support plate 408.

Also, each of the central cylindrically-shaped plasma generation microchamber 409A and the plurality of annular-shaped plasma generation microchambers 409B-409D includes an upper ground plate (like 469B) affixed to its corresponding portion of the number of support structures 414A-414D. Also, each of the central cylindrically-shaped plasma generation microchamber 409A and the plurality of annular-shaped plasma generation microchambers 409B-409D includes, an upper insulator sheet (like 465B) disposed between the upper ground plate (like 469B) and the upper electrode (like 451B).

Also, each of the central cylindrically-shaped plasma generation microchamber 409A and the plurality of annular-shaped plasma generation microchambers 409B-409D includes a lower insulator sheet (like 467B) disposed on a lower surface of the lower electrode (like 453B) opposite from the plasma generation region (like 480B). Also, each of the central cylindrically-shaped plasma generation microchamber 409A and the plurality of annular-shaped plasma generation microchambers 409B-409D includes a lower ground plate (like 471B) disposed on a lower surface of the lower insulator sheet (like 467B) opposite from the lower electrode (like 453B).

With reference back to FIG. 1A, the semiconductor substrate processing system 400 includes the substrate support 107 defined to support the substrate 105 in exposure to the substrate processing region 106. The top plate assembly 407 is positioned above and spaced apart from the substrate support 107, such that the substrate processing region 106 exists between the top plate assembly 407 and the substrate support 107. The top plate assembly 407 includes the central plasma generation microchamber 409A at a location substantially centered on the top plate assembly 407. The top plate assembly 407 also includes a plurality of annular-shaped plasma generation microchambers 409B-409D positioned in a concentric manner about the central plasma generation microchamber 409A.

Adjacently positioned ones of the central plasma generation microchamber 409A and the plurality of annular-shaped plasma generation microchambers 409B-409D are spaced apart from each other so as to form a number of axial exhaust vents 410A-410D therebetween. Also, each of the central plasma generation microchamber 409A and the plurality of annular-shaped plasma generation microchambers 409B-409D is defined to generate a corresponding plasma therein and supply reactive constituents of its plasma to the substrate processing region 106 between the top plate assembly 407 and the substrate support 107.

Each of the central plasma generation microchamber 409A and the plurality of annular-shaped plasma generation microchambers 409B-409D includes a plasma generation region (like 480B) bounded by an upper electrode (like 451B), a lower electrode (like 453B), and an electrically insulating sidewall enclosure (like 463B1/463B2) extending between the upper electrode (like 451B) and the lower electrode (like 453B), so as to enclose the plasma generation region (like 480B). Each of the upper electrode (like 451B) and the lower electrode (like 453B) of each of the central plasma generation microchamber 409A and the plurality of annular-shaped plasma generation microchambers 409B-409D is electrically connected to receive power from a respective independently controllable power supply 441. Also, each of the central plasma generation microchamber 409A and the plurality of annular-shaped plasma generation microchambers 409B-409D is fluidly connected to receive a process gas from a respective process gas supply 443. The axial exhaust vents 410A-410D are fluidly connected to a peripheral exhaust vent 412 within the chamber outside a periphery of the substrate support 107.

It should be understood that in various embodiments, the different plasma generation microchambers 409A-409D can be process controlled with regard to gas type, gas flow rate, gas pressure, power frequency, power amplitude, on duration, off duration, and timing sequence. Also, the different plasma generation microchambers 409A-409D can be operated in either a continuous manner, a pulsed manner, or a sequenced manner.

Figure 3:
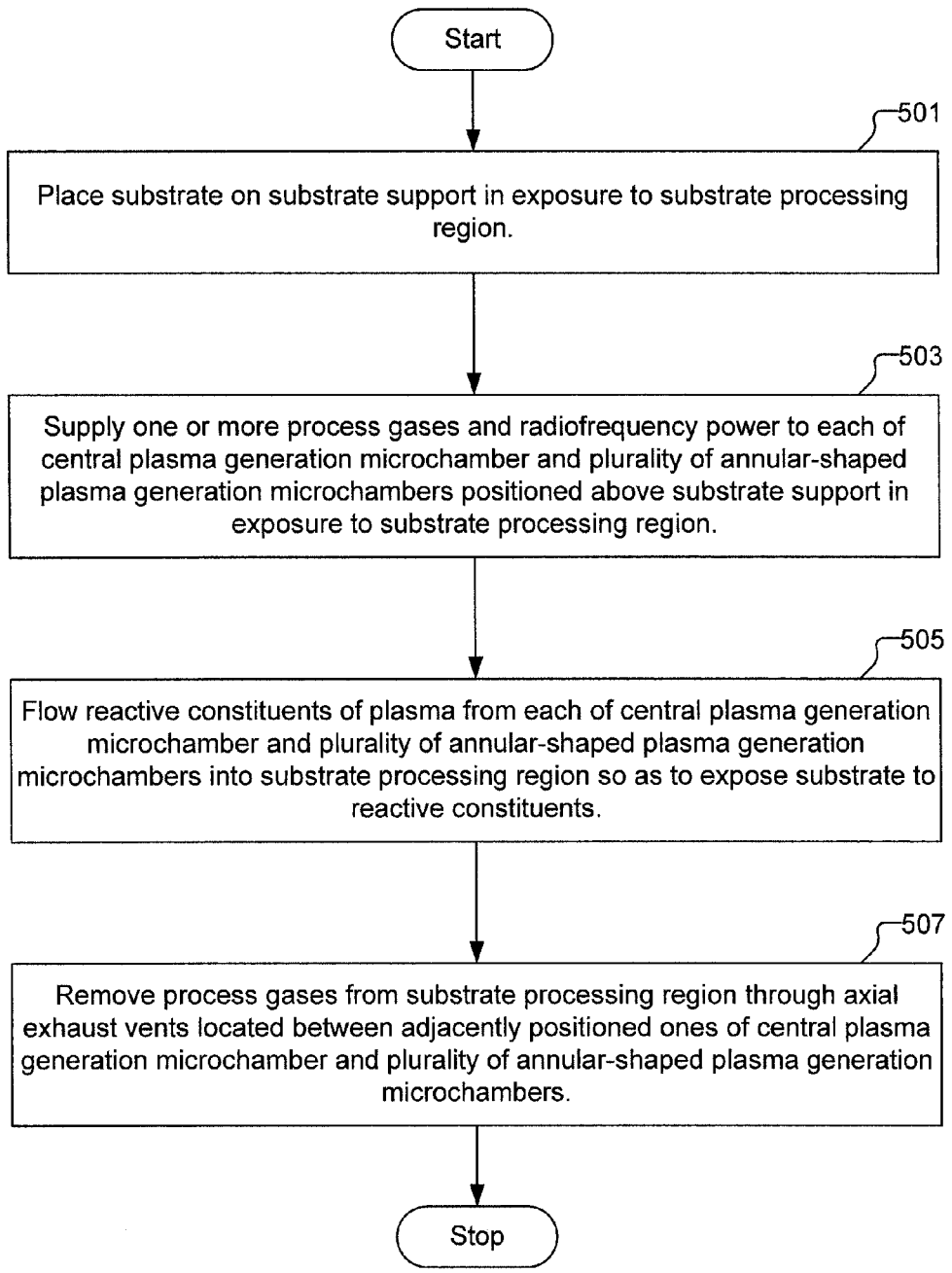
FIG. 3 shows a flowchart of a method for processing a semiconductor substrate, in accordance with one embodiment of the present invention.

FIG. 3 shows a flowchart of a method for processing a semiconductor substrate, in accordance with one embodiment of the present invention. The method includes an operation 501 for placing a substrate on a substrate support in exposure to a substrate processing region. The method also includes an operation 503 for supplying one or more process gases and radiofrequency power to each of a central plasma generation microchamber and a plurality of annular-shaped plasma generation microchambers positioned above the substrate support in exposure to the substrate processing region. The radiofrequency power transforms the one or more process gases into a plasma in each of the central plasma generation microchamber and the plurality of annular-shaped plasma generation microchambers. In one embodiment, the supply of the one or more process gases and radiofrequency power in operation 503 is separately and independently controlled for each of the central plasma generation microchamber and the plurality of annular-shaped plasma generation microchambers.

The method further includes an operation 505 for flowing reactive constituents of the plasma from each of the central plasma generation microchamber and the plurality of annular-shaped plasma generation microchambers into the substrate processing region so as to expose the substrate to the reactive constituents. The method also includes an operation 507 for removing process gases from the substrate processing region through axial exhaust vents located between adjacently positioned ones of the central plasma generation microchamber and the plurality of annular-shaped plasma generation microchambers.

In one embodiment, the method also includes operating the upper electrode and the lower electrode in each of the central plasma generation microchamber and the plurality of annular-shaped plasma generation microchambers in a push-pull manner to generate ballistic electrons and direct the ballistic electrons into the substrate processing region. Also, in one embodiment, the method includes applying a bias power to a bias electrode disposed within the substrate support to influence movement of charged species within the substrate processing region. Also, in one embodiment, the method includes removing process gases from the substrate processing region through a radial exhaust vent located at a periphery of the substrate support.

The top plate assembly 407 disclosed herein provides for embedding of remote plasma sources, i.e., plasma generation microchambers 409A-409D, within a plasma processing chamber 401. In this instance, remote plasma sources refer to the plasma being generated within the plasma generation regions (like 480B) of the plasma generation microchambers 409A-409D, where the plasma generation regions (like 480B) are not in direct open exposure to the substrate. In other words, the plasma generation microchambers 409A-409D of the top plate assembly 407 are considered remote plasma sources because the reactive constituents must travel from the plasma generation regions (like 480B) through the outlet passages (like 455B) to reach the substrate processing region 106.

The plasma generation microchambers 409A-409D provide for independent radical generation in their respective plasma generation regions (like 480B). Also, the plasma generation microchambers 409A-409D provide for electron beam generation and injection into the substrate processing region 106 to enhance an electron beam excited plasma (EBEP) effect within the substrate processing region 106. The use of radially segmented plasma generation microchambers 409A-409D, i.e., annular-shaped remote plasma sources, provides for control of the radial distribution of radicals and ions across the substrate processing region parallel to the substrate support 107. It should be understood that while the example embodiment shown and described with regard to FIGS. 1A-2D includes four concentric plasma generation microchambers 409A-409D, other embodiments may utilize either more or less plasma generation microchambers. Additionally, other embodiments may utilize plasma generation microchambers of varying size as a function of radial location relative to the substrate support. Also, in one embodiment, the system 400 includes a hollow anode ground electrode at a boundary area between the outermost plasma generation microchamber and the chamber 401 to enhance the EBEP effect and reduce the plasma potential within the chamber 401.

Also, it should be understood that the axial exhaust vents 410A-410D within the top plate assembly 407 provide for enhanced process gas and byproduct residence time control within the substrate processing region 106. For example, in some applications, a low residence time is required to reduce byproduct redeposition. In one embodiment, the axial exhaust vents 410A-410D in the top plate assembly 407 provide for a residence time of process gas within the substrate processing region of less than 10 milliseconds. Also, it should be understood that the axial exhaust vents 410A-410D in the top plate assembly 407 provide for a substantially increased conductance of process gas through the substrate processing region 106 as compared to use of the radial exhaust vent 426 alone. For example, in one embodiment, the radial exhaust vent 426 alone provides for process gas conductance of about 510 liters per second through the substrate processing region 106, whereas the combination of the axial exhaust vents 410A-410D with the radial exhaust vent 426 provides for process gas conductance of about 1270 liters per second through the substrate processing region 106.

In view of the disclosure herein, it should be appreciated that the semiconductor substrate processing system 400, and top plate assembly 407 implemented therein, provides the following enhancements, among others:
- independent ion and neutral flux control across the substrate during substrate processing operations,
- independent control of the ion bombardment energy onto the substrate, and
- across substrate process gas and byproduct management associated with etch and deposition processes.

While this invention has been described in teens of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A plasma generation and axial exhaust assembly, comprising:
an upper support plate;
a number of support structures affixed to the upper support plate so as to extend in a substantially perpendicular direction away from the upper support plate;
a central cylindrically-shaped plasma generation microchamber affixed to a first portion of the number of support structures at a location substantially centered upon the upper support plate; and
a plurality of annular-shaped plasma generation microchambers affixed to corresponding portions of the number of support structures, the plurality of annular-shaped plasma generation microchambers positioned in a concentric manner about the central cylindrically-shaped plasma generation microchamber,
wherein adjacently positioned ones of the central cylindrically-shaped plasma generation microchamber and the plurality of annular-shaped plasma generation microchambers are spaced apart from each other so as to form a number of axial exhaust vents therebetween, wherein each axial exhaust vent is fluidly connected to a fluid flow region between the number of support structures and between the upper support plate and each of the plurality of annular-shaped plasma generation microchambers, wherein the fluid flow region is fluidly connected to a peripheral exhaust vent formed at a periphery of the upper support plate between the upper support plate and an outermost one of the plurality of annular-shaped plasma generation microchambers.

2. A plasma generation and axial exhaust assembly as recited in claim 1, wherein each of the central cylindrically-shaped plasma generation microchamber and the plurality of annular-shaped plasma generation microchambers includes a plasma generation region fluidly connected to a process gas supply.

3. A plasma generation and axial exhaust assembly as recited in claim 2, wherein each of the central cylindrically-shaped plasma generation microchamber and the plurality of annular-shaped plasma generation microchambers includes an upper electrode disposed in exposure to the plasma generation region, and a lower electrode disposed in exposure to the plasma generation region.

4. A plasma generation and axial exhaust assembly as recited in claim 3, wherein each of the upper and lower electrodes is electrically connected to a separate independently controllable power supply.

5. A plasma generation and axial exhaust assembly as recited in claim 3, wherein each of the upper and lower electrodes is physically separated by an electrically insulating sidewall enclosure, wherein the sidewall enclosure forms a peripheral boundary of the plasma generation region.

6. A plasma generation and axial exhaust assembly as recited in claim 5, wherein each of the central cylindrically-shaped plasma generation microchamber and the plurality of annular-shaped plasma generation microchambers includes a number of output passages formed to direct a fluid flow from the plasma generation region in a direction substantially perpendicular to and away from the upper support plate.

7. A plasma generation and axial exhaust assembly as recited in claim 6, wherein each of the central cylindrically-shaped plasma generation microchamber and the plurality of annular-shaped plasma generation microchambers includes an upper ground plate affixed to its corresponding portion of the number of support structures, and an upper insulator sheet disposed between the upper ground plate and the upper electrode.

8. A plasma generation and axial exhaust assembly as recited in claim 7, wherein each of the central cylindrically-shaped plasma generation microchamber and the plurality of annular-shaped plasma generation microchambers includes a lower insulator sheet disposed on a lower surface of the lower electrode opposite from the plasma generation region, and a lower ground plate disposed on a lower surface of the lower insulator sheet opposite from the lower electrode.

9. A plasma generation and axial exhaust assembly as recited in claim 8, wherein each of the upper insulator sheet and the lower insulator sheet has an electrical resistance within a range extending from about 50 picoFarads to about 70 picoFarads.

10. A plasma generation and axial exhaust assembly as recited in claim 5, wherein the sidewall enclosure has an electrical resistance within a range extending from about 3 picoFarads to about 10 picoFarads.

11. A semiconductor substrate processing system, comprising:

a substrate support defined to support a substrate in exposure to a processing region; and a top plate assembly positioned above and spaced apart from the substrate support, such that the processing region exists between the top plate assembly and the substrate support, the top plate assembly including a central plasma generation microchamber at a location substantially centered on the top plate assembly, the top plate assembly also including a plurality of annular-shaped plasma generation microchambers positioned in a concentric manner about the central plasma generation microchamber, wherein adjacently positioned ones of the central plasma generation microchamber and the plurality of annular-shaped plasma generation microchambers are spaced apart from each other so as to form a number of axial exhaust vents therebetween, and wherein each of the central plasma generation microchamber and the plurality of annular-shaped plasma generation microchambers is defined to generate a corresponding plasma therein and supply reactive constituents of its plasma to the processing region between the top plate assembly and the substrate support.

12. A semiconductor substrate processing system as recited in claim 11, wherein the number of axial exhaust vents are fluidly connected to a peripheral exhaust vent within the chamber outside a periphery of the substrate support.

13. A semiconductor substrate processing system as recited in claim 11, wherein each of the central plasma generation microchamber and the plurality of annular-shaped plasma generation microchambers includes a plasma generation region bounded by an upper electrode, a lower electrode, and an electrically insulating sidewall enclosure extending between the upper and lower electrodes so as to enclose the plasma generation region.

14. A semiconductor substrate processing system as recited in claim 13, wherein each of the upper and lower electrodes of each of the central plasma generation microchamber and the plurality of annular-shaped plasma generation microchambers is electrically connected to receive power from a respective independently controllable power supply.

15. A semiconductor substrate processing system as recited in claim 13, wherein each of the central plasma generation microchamber and the plurality of annular-shaped plasma generation microchambers is fluidly connected to receive a process gas from a respective process gas supply.

16. A semiconductor substrate processing system as recited in claim 13, wherein each of the central plasma generation microchamber and the plurality of annular-shaped plasma generation microchambers includes an upper ground plate and an upper insulator sheet disposed between the upper ground plate and the upper electrode.

17. A semiconductor substrate processing system as recited in claim 16, wherein each of the central plasma generation microchamber and the plurality of annular-shaped plasma generation microchambers includes a lower insulator sheet disposed on a lower surface of the lower electrode opposite from the plasma generation region, and a lower ground plate disposed on a lower surface of the lower insulator sheet opposite from the lower electrode.

18. A semiconductor substrate processing system as recited in claim 17, wherein the sidewall enclosure has an electrical resistance within a range extending from about 3 picoFarads to about 10 picoFarads.

19. A semiconductor substrate processing system as recited in claim 18, wherein each of the upper insulator sheet and the lower insulator sheet has an electrical resistance within a range extending from about 50 picoFarads to about 70 picoFarads.

20. A semiconductor substrate processing system as recited in claim 17, wherein the top plate assembly includes an upper support plate and a number of support structures affixed to the upper support plate so as to extend in a substantially perpendicular direction away from the upper support plate toward the substrate support, wherein the central plasma generation microchamber is affixed to some of the number of support structures, and wherein each of the plurality of annular-shaped plasma generation microchambers is affixed to some of the number of support structures.

21. A semiconductor substrate processing system as recited in claim 20, wherein each axial exhaust vent is fluidly connected to a fluid flow region between the number of support structures and between the upper support plate and each of the plurality of annular-shaped plasma generation microchambers, wherein the fluid flow region is fluidly connected to a peripheral exhaust vent formed at a periphery of the upper support plate between the upper support plate and an outermost one of the plurality of annular-shaped plasma generation microchambers.

* * * * *